United States Patent
Deng et al.

(10) Patent No.: US 9,184,955 B2
(45) Date of Patent: Nov. 10, 2015

(54) METHOD AND DEVICE FOR SIGNAL PROCESSING

(71) Applicant: MStar Semiconductor, Inc., Hsinchu Hsien (TW)

(72) Inventors: Jun-Xiong Deng, Shanghai (CN); Chih-Ming Hung, Mckinney, TX (US)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 14/591,559

(22) Filed: Jan. 7, 2015

(65) Prior Publication Data

US 2015/0195110 A1    Jul. 9, 2015

(30) Foreign Application Priority Data

Jan. 9, 2014    (CN) .......................... 2014 1 0010437

(51) Int. Cl.
*H04L 25/08*    (2006.01)
*H03F 1/32*    (2006.01)
*H03F 3/19*    (2006.01)

(52) U.S. Cl.
CPC .............. *H04L 25/08* (2013.01); *H03F 1/3258* (2013.01); *H03F 3/19* (2013.01); *H03F 2200/451* (2013.01); *H03F 2201/3215* (2013.01)

(58) Field of Classification Search
None
See application file for complete search history.

(56) References Cited

U.S. PATENT DOCUMENTS

| | | | |
|---|---|---|---|
| 6,373,902 B1 * | 4/2002 | Park et al. | ....................... 375/296 |
| 2003/0021358 A1 * | 1/2003 | Galins | ............................ 375/297 |
| 2011/0306300 A1 | 12/2011 | Behera et al. | |
| 2011/0312290 A1 * | 12/2011 | Beeler et al. | ............... 455/114.3 |

* cited by examiner

*Primary Examiner* — Leon-Viet Nguyen
(74) *Attorney, Agent, or Firm* — WPAT, PC; Justin King

(57) ABSTRACT

A method for signal processing is provided. The method includes: obtaining a predistortion signal for compensating nonlinear distortion generated by a transmission path; adding the predistortion signal to the transmission path to compensate the nonlinear distortion; and outputting the nonlinear distortion compensated signal by the transmission path. With the above method, the nonlinear distortion of the transmission path can be compensated without modifying a current transmission path, thereby enhancing transmission performance of a transmitter by using a simple structure.

16 Claims, 3 Drawing Sheets

METHOD AND DEVICE FOR SIGNAL PROCESSING

This application claims the benefit of People's Republic of China application Serial No. 201410010437.3, filed Jan. 9, 2014, the subject matter of which is incorporated herein by reference.

BACKGROUND OF THE INVENTION

1. Field of the Invention

The invention relates in general to a wireless communication technology, and more particularly, to a method and a device for signal processing.

2. Description of the Related Art

The Long-Term Evolution (LTE) standard demands a transmitter to have different transmission requirements for different frequency bands. For example, for the frequency band 13 (Band 13), as the Band 13 is located only 2 MHz from a public safety band, the LTE standard requires a transmitter operating on the Band 13 to significantly reduce the transmission power in order to guarantee that the leaked power posed on the public safety band is within a very small range, e.g., a range within −57 dBm. However, reducing the transmission power noticeably affects the transmission performance of the transmitter.

In a transmission path of a transmitter, processes including baseband filtering, frequency mixing and driving amplification are performed to obtain a radio-frequency (RF) signal for transmission. However, due to a nonlinear distortion of the transmission path, harmonic signals occur near the RF signal to be transmitted. For example, the harmonic signals may be intermodulation 3 (IM3) signals, also referred to as 4FMOS signals, which are generated by the nonlinear distortion of the transmission path. The frequency of such signals exactly falls within the range of the public safety band. Due to the presence of the 4FMOS signals, a transmitter operating on the Band 13 barely achieves the requirements of the LTE standard.

Further, the generation of the harmonic signals consumes the power of a transmitter, lowering not only the power of RF signal transmitted but also the transmission performance of the transmitter.

The U.S. Patent Publication No. 20110306300A1 discloses a method for harmonic suppression and/or rejection. The above method is a harmonic elimination method base on analog nonlinearity. To also achieve preferred suppression effects, during the process for eliminating harmonic signals, a calibration operation needs to be performed. However, such analog operation has complicated implementation and is thus not practical.

Therefore, there is a need for a simple method for compensating the nonlinear distortion of a transmission path of a transmitter and for enhancing the transmission performance of the transmitter.

SUMMARY OF THE INVENTION

The invention is directed to a signal and a method for compensating the nonlinear distortion of a transmission of a transmitter and for enhancing the transmission performance of the transmitter.

A method for signal processing is provided by the present invention. The method includes obtaining a predistortion signal for compensating a nonlinear distortion generated by a transmission path, adding the predistortion signal to the transmission path to compensate the nonlinear distortion, and outputting the nonlinear distortion compensated signal by the transmission path.

The transmission path includes a driving amplifier. The step of adding the predistortion signal to the transmission path to compensate the nonlinear distortion includes adding the predistortion signal to an input end of the driving amplifier, and amplifying a frequency mixed signal added with the predistortion signal. The frequency mixed signal includes a first frequency mixed signal and a second frequency mixed signal. The nonlinear distortion generated by the process that the driving amplifier performs on first frequency mixed signal and the second frequency mixed signal is compensated to obtain an RF signal in which the nonlinear distortion of the driving amplifier is eliminated.

A device for signal processing is further provided by the present invention. The device includes: an obtaining module, configured to obtain a predistortion signal for compensating a nonlinear distortion generated by a transmission path; an adding module, configured to obtain the predistortion signal from the obtaining module, and to add the predistortion signal to the transmission path to compensate the nonlinear distortion; and an outputting putting, configured to output the nonlinear distortion compensated signal of the transmission path.

In the present invention, a predistortion signal is added to a transmission path to compensate a nonlinear distortion of the transmission path. Without modifying the current transmission path, the nonlinear distortion of the transmission path can be compensated, thereby enhancing transmission performance of a transmitter by using a simple approach.

The above and other aspects of the invention will become better understood with regard to the following detailed description of the preferred but non-limiting embodiments. The following description is made with reference to the accompanying drawings.

DETAILED DESCRIPTION OF THE INVENTION

Embodiments of the present invention are described in detail below. Apart from the disclosed embodiments, the present invention is also applicable to other embodiments. The scope of the present invention is not limited by these non-limiting embodiments, and is defined in accordance with the appended claims. To better describe the contents of the present invention to one person skilled in the art and to keep the drawings clear, parts of the drawings are not drawn to actual sizes and ratios, and certain sizes and other associated scales may be emphasized to appear exaggerated, with unrelated details not entirely depicted.

Figure 1:
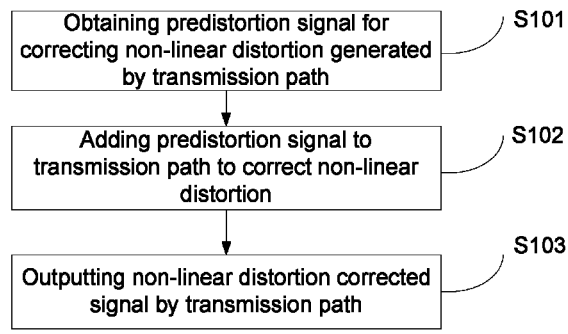
FIG. 1 is a flowchart of a method for signal processing according to a first embodiment of the present invention.

FIG. 1 shows a flowchart of a method for signal processing according to a first embodiment of the present invention. It should be noted that, given that substantially effects are achieved, the method of the present invention is not limited to be performed in the sequence in FIG. 1. As shown in FIG. 1, the method includes following steps.

In step S101, a predistortion signal for compensating a nonlinear distortion generated by a transmission path is obtained.

In step S102, the predistortion signal is added to the transmission path to compensate the nonlinear distortion.

In step S103, the nonlinear distortion compensated signal is outputted by the transmission path.

In step S101, the nonlinear distortion refers to a nonlinear relationship between an output signal and an input signal of the transmission path. The output signal is added with harmonic signals having different frequencies, and may include harmonic distortion and modulation distortion. The transmission path may be applied for wireless communication standards, such as Long Term Evolution (LTE), Wideband Code Division Multiple Access (WCDM), and Time Division-Synchronous Code Division Multiple Access (TD-SCDMA) standards. Taking the LTE standard for example, the transmission path may include a baseband filter, a mixer and a driving amplifier. After the input signal undergoes processes of filtering by the baseband filter, frequency conversion by the mixer and amplification by the driving amplifier, the output signal added with harmonic signals may be obtained due to nonlinear characteristics of the baseband filter, the mixer and the driving amplifier. To reduce the effects of harmonic signals on the transmission path, a predistortion signal is introduced into the transmission path to compensate the harmonic signals caused by the nonlinearity of the transmission path. For example, the predistortion signal may be generated by a modem, a double-carrier modem, or an on-chip microprocessor.

In step S102, the predistortion signal may be added to an input end of the filter, or may be added to an input end of the driving amplifier.

In step S103, the nonlinearity distortion compensated signal is an output signal having a frequency within a radio-frequency (RF) range, and may be radiated towards the air in form of electromagnetic waves via an antenna.

In the present invention, a predistortion signal is added to a transmission path to compensate a nonlinear distortion of the transmission path. Without modifying the current transmission path, the nonlinear distortion of the transmission path can be compensated, thereby enhancing transmission performance of a transmitter by using a simple approach.

Figure 2:
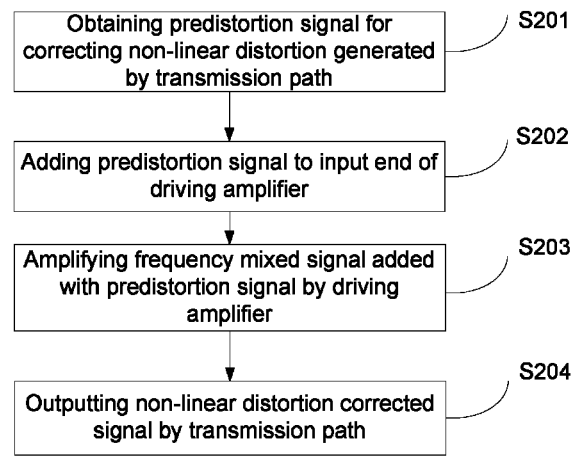
FIG. 2 is a flowchart of a method for signal processing according to a second embodiment of the present invention.

FIG. 2 shows a flowchart of a method for signal processing according to a second embodiment of the present invention. It should be noted that, given that substantially effects are achieved, the method of the present invention is not limited to be performed in the sequence in FIG. 2. As shown in FIG. 2, the method includes following steps.

In step S201, a predistortion signal for compensating a nonlinear distortion generated by a transmission path is obtained. In step S201, the transmission path includes a driving amplifier. The predistortion signal for compensating the nonlinearity generated by the driving amplifier.

In step S202, the predistortion signal is added to an input end of the driving amplifier. In step S202, the predistortion signal is frequency mixed with a frequency mixed signal and then added to the input end of the driving amplifier.

In step S203, the frequency mixed signal added with the predistortion signal is amplified by the driving amplifier. In step S203, the input signal $V_{in}$ of the driving amplifier includes a frequency mixed signal, which includes a first frequency mixed signal F1 and a second frequency mixed signal F2. The first frequency mixed signal F1 is an effective signal to be transmitted, and the second frequency mixed signal F2 is a harmonic signal. A frequency of the second frequency mixed signal F2 is about three times of a frequency of the first frequency mixed signal F1.

Taking a three-order nonlinear distortion of the driving amplifier for example, when the predistortion signal is not added, an output signal $V_{out}$ of the driving amplifier may be represented by an equation below:

$$V_{out}=A_1 V_{in}+A_2 V_{in}^2+A_3 V_{in}^3$$

In the above equation, $A_1$, $A_2$ and $A_3$ are respectively one-order, two-order and three-order nonlinear coefficients corresponding to the driving amplifier.

The first frequency mixed signal F1 is set to have an amplitude |F1| and a phase ∠F1; the second frequency mixed signal F2 is set to have an amplitude |F2| and a phase ∠F2. The one-order nonlinear coefficient $A_1$ of the driving amplifier has an amplitude a1 and a phase ∠θ1; the two-order nonlinear coefficient $A_2$ of the driving amplifier has an amplitude a2 and a phase φθ2; the three-order nonlinear coefficient $A_3$ of the driving amplifier has an amplitude a3 and a phase ∠θ3.

By substituting $V_{in}$=F1+F2 into the above equation, as the cubic terms are the existence of the three-order nonlinear coefficients, a three-order intermodulation component F2−2F1 is generated in the output signal. The three-order intermodulation component F2−2F1 has a frequency near that of the first frequency mixed signal F1 to be transmitted, and corresponds to an amplitude |¾*a3*F2*F1*F1| and a phase ∠θ3+∠F2−∠F1−∠F1.

To eliminate the three-order intermodulation component F2−2F1, the predistortion signal F3 is introduced to the input end of the driving amplifier. The predistortion signal F3 corresponds to an amplitude |F3| and a phase ∠F3.

After the amplification performed by the driving amplifier, the amplified predistortion signal ∠F3 has a changed corresponding amplitude |a1*F3| and a changed corresponding phase ∠θ1+∠F3.

To most effectively eliminate the three-order intermodulation component F2−2F1 generated by the process that the driving amplifier performs on first frequency mixed signal F1 and the second frequency mixed signal F2, the amplified predistortion signal F3 and the three-order intermodulation component F2−2F1 are required to have an equal amplitude and opposite phases. That is:

$$|¾*a3*F2*F1*F1|=|a1*F3|$$

$$\angle\theta3+\angle F2-\angle F1-\angle F1+180°=\angle\theta1+\angle F3$$

By converting the above equation, it is obtained that:

$$|F3|=|¾*a3*F2*F1*F1|/a1$$

$$\angle F3=\angle\theta3+\angle F2-\angle F1-\angle F1+180°-\angle\theta1$$

When the amplitude |F3| and the phase ∠F3 of the predistortion signal F3 satisfy the above equations, the three-order intermodulation component F2−2F1 is completely eliminated. One person skilled in the art can understand that, given the condition that the predistortion signal and the three-order intermodulation component have opposite phases, when the amplitude of the predistortion signal is smaller than an absolute value of $$|3/4*a3*F2*F1*F1|/a1,$$

the effect of eliminating the three-order intermodulation component F2−2F1 can be achieved to thereby reduce the effect of the nonlinear distortion of the driving amplifier.

In step S204, the transmission path outputs the nonlinear distortion compensated signal. In step S204, the output end of the driving amplifier outputs the RF signal in which the nonlinear distortion of the driving amplifier is eliminated.

In the present invention, a predistortion signal is added to a transmission path to compensate a nonlinear distortion of the transmission path. Without modifying the current transmission path, the nonlinear distortion of the transmission path can be compensated, thereby enhancing transmission performance of a transmitter by using a simple approach.

Figure 3:
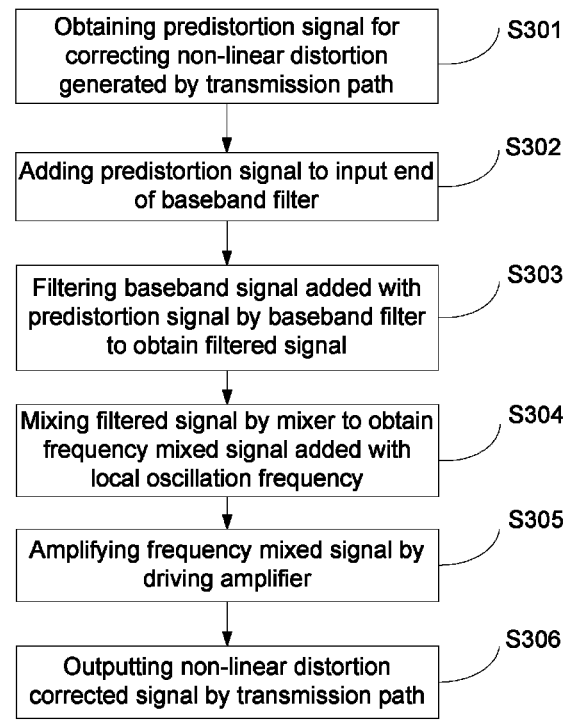
FIG. 3 is a flowchart of a method for signal processing according to a third embodiment of the present invention.

FIG. 3 shows a flowchart of a method for signal processing according to a third embodiment of the present invention. It should be noted that, given that substantially effects are achieved, the method of the present invention is not limited to be performed in the sequence in FIG. 3. As shown in FIG. 3, the method includes following steps.

In step S301, a predistortion signal for compensating a nonlinear distortion generated by a transmission path is obtained. In step S301, the transmission path includes a baseband filer, a mixer and a driving amplifier. A baseband signal BB having a center frequency $f_{BB}$ or a bandwidth $\Delta f$ undergoes processes of filtering by the baseband filter, mixing by the mixer and amplification by the driving amplifier to be modulated into a signal having a frequency $f_{LO}+\Delta f$, where $f_{LO}$ is a local oscillation frequency provided by the mixer.

Known to one person skilled in the art, undesired harmonic signals are frequently generated in a transmission path due to a nonlinear distortion of the transmission path. For example, such undesired harmonic signals may be three-order harmonic signals generated by the nonlinearity of the mixer in the transmission path. The three-order harmonic signals have a frequency $3*f_{LO}$. Further, the three-order harmonic signals and the baseband signal become frequency mixed to generate useless signals having a frequency $3*f_{LO}-\Delta f$. When the signals having the frequency $3*f_{LO}-\Delta f$ and the signal having a frequency $f_{LO}+\Delta f$ are added together to an input end of the driving amplifier, due to the nonlinearity of the driving amplifier, intermodulation signals having a frequency $f_{LO}-3*\Delta f$ are generated an output end of the driving amplifier. As the frequency $f_{LO}-3*\Delta f$ of the intermodulation signals and the frequency $f_{LO}+\Delta f$ of the signals to be transmitted only differ by $4*\Delta f$, the presence of the intermodulation signals significantly degrades the transmission performance of the transmission path.

The predistortion signal is used for compensating the nonlinearity generated by the baseband filter, the mixer and the driving amplifier. In the embodiment, the predistortion signal PD has a frequency $3*f_{BB}$, and is applied for compensating the intermodulation signals having a frequency $f_{LO}-3*\Delta f$ generated by the nonlinearity of the mixer and the driving amplifier.

In step S302, the predistortion signal is added to an input end of the baseband filter. In step S302, the predistortion signal and the baseband signal are mixed and then added to the input end of the filter.

In step S303, the baseband signal added with the predistortion signal is filtered by the baseband filter to obtain a filtered signal. In step S303, an input signal of the baseband signal includes the baseband signal BB and the predistortion signal PD.

Assume that the baseband signal BB has an amplitude of 1 and a phase of 0°, the predistortion signal PD has an amplitude |PD| and a phase ∠PD, the one-order nonlinear coefficient of the baseband filter has an amplitude b1 and a phase ∠β1, and the three-order nonlinear coefficient is omitted.

Having undergone the process of the baseband filter, the filtered baseband signal BB has a changed corresponding amplitude b1 and a changed corresponding phase ∠β1; the filtered predistortion signal PD has a changed corresponding amplitude |PD*b1| and a changed corresponding phase ∠β1−∠PD. The filtered signal is the sum of the filtered baseband signal and the filtered predistortion signal.

In step S304, the filtered signal is frequency mixed by the mixer to obtain a frequency mixed signal added with the local oscillation frequency. In step S304, the frequency mixed signal includes a first frequency mixed signal F1 corresponding to the baseband signal, a second frequency mixed signal F2 generated correspondingly to the nonlinearity of the mixer, and a third frequency mixed signal F3 generated correspondingly to the predistortion signal. The first frequency mixed signal F1 corresponds to effective signals to be transmitted, and has a frequency $f_{LO}+\Delta f$. The second frequency mixed signal F2 corresponds to harmonic signals, and has a frequency $3f_{LO}-\Delta f$. The third frequency mixed signal F3 correspondingly compensates the predistortion signal of the nonlinearity distortion of the transmission path, and has a frequency $f_{LO}-3\Delta f$.

The one-order nonlinearity coefficient of the mixer is set to have an amplitude of and a phase ∠o1; the three-order nonlinearity coefficient is set to have an amplitude o3 and a phase ∠o3.

Further, the local oscillation signal provided by the mixer is a square wave signal, and has an Fourier expansion represented as:

$$f(t) = \frac{4}{\pi} * \left[ \sin wt + \frac{1}{3} * \sin 3wt + \frac{1}{5} * \sin 5wt + \ldots + \frac{1}{n} * \sin nwt + \ldots \right],$$

where $w=2\pi f_{LO}$.

After the filtered signal is frequency mixed by the mixer, the first frequency mixed signal F1 outputted from the mixer has a corresponding amplitude $b1*4/\pi*o1$ and a corresponding phase ∠o1+∠β1, the second frequency mixed signal F2 has a corresponding amplitude $b1*4/\pi*⅓*o3$ and a corresponding phase ∠o3−∠β1, and the third frequency mixed signal F3 has a corresponding amplitude $|PD*b1*/4/\pi*o1|$ and a corresponding phase ∠o1−∠PD.

In step S305, the frequency mixed signal is amplified by the driving amplifier. In step S305, the input signal of the driving amplifier includes the first frequency mixed signal F1, the second frequency mixed signal F2 and the third frequency mixed signal F3.

The one-order nonlinearity coefficient $A_1$ of the driving amplifier is set to have an amplitude a1 and a phase ∠θ1; the three-order nonlinearity coefficient $A_3$ is set to have an amplitude a3 and a phase ∠θ3.

Due to the presence of the three-order nonlinear coefficient, intermodulation signals having a frequency $f_{LO}-3\Delta f$ are generated after the first frequency mixed signal F1 and the second frequency mixed signal F2 undergo the process of the driving amplifier. The intermodulation signals correspond to an amplitude $|¾*a3*4/\pi*4/\pi*4/\pi*⅓*b1*b1*b1*o1*o1*o3|$ and a phase ∠o3−∠β1−2*∠o1−2*∠β1+∠θ3.

After having been amplified by the driving amplifier, the amplified third frequency mixed signal F3 has a changed corresponding amplitude $|a1*PD*4/\pi*b1*o1|$ and a changed corresponding phase ∠θ1+∠o1−∠PD.

To most effectively compensate the intermodulation signals having a frequency generated by the process that the driving amplifier performs on first frequency mixed signal F1 and the second frequency mixed signal F2, the amplified predistortion signal F3 and the intermodulation signals are required to have an equal amplitude and opposite phases. That is:

$$|16/\pi^3 * a3 * b1 * b1 * b1 * o1 * o1 * o3| = |a1 * PD * 4/\pi * b1 * o1|$$

$$\angle o3 - \angle \beta 1 - 2 * \angle o1 - 3 * \angle \beta 1 + \angle 3 + 180° = \angle \theta 1 + \angle o1 - \angle PD$$

By converting the above equation, it is obtained that:

$$|PD| = 4/\pi^2 * a3/a1 * b1 * b1 * o1 * o3$$

$$\angle PD = 3 * \angle o1 + 3 * \angle \beta 1 - \angle o3 - \angle \theta 3 + \angle \theta 1 - 180$$

When the amplitude |PD| and the phase ∠PD of the predistortion signal PD satisfy the above equations, the intermodulation signals are completely eliminated. One person skilled in the art can understand that, given the condition that the predistortion signal and the intermodulation signals have opposite phases, when the amplitude of the predistortion signal is smaller than an absolute value of $$4/\pi^2 * a3/a1 * b1 * b1 * o1 * o3,$$

the effect of eliminating the intermodulation signals can be achieved to thereby reduce the effect of the nonlinear distortion of the transmission path.

In step S306, the nonlinear distortion compensated signal is outputted by the transmission path. In step S306, the transmission path outputs the RF signal in which the nonlinear distortion of transmission path, i.e., the mixer and the driving amplifier, is eliminated.

In the present invention, a predistortion signal is added to a transmission path to compensate a nonlinear distortion of the transmission path. Without modifying the current transmission path, the nonlinear distortion of the transmission path can be compensated, thereby enhancing transmission performance of a transmitter by using a simple approach.

Figure 4:
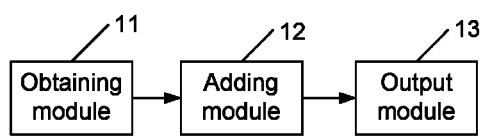
FIG. 4 is a schematic diagram of a device for signal processing according to the first embodiment of the present invention.

FIG. 4 shows a schematic diagram of a device for signal processing according to the first embodiment of the present invention. As shown in FIG. 4, the device includes an obtaining module 11, an adding module 12 and an output module 13.

The obtaining module 11 obtains a predistortion signal for compensating a nonlinearity distortion generated by a transmission path, and may be a modem, a double-carrier modem, or an on-chip microprocessor.

The adding module 12, connected to the obtaining module 11, obtains the predistortion signal from the obtaining module 11, and adds the predistortion signal to the transmission path to compensate the nonlinear distortion.

The output module 13, connected to the adding module 12, outputs the nonlinearity distortion compensated signal in the transmission path. More specifically, the output module 13 adds the predistortion signal added by the adding module 12 in the transmission path, and outputs the nonlinearity distortion compensated signal.

Figure 5:
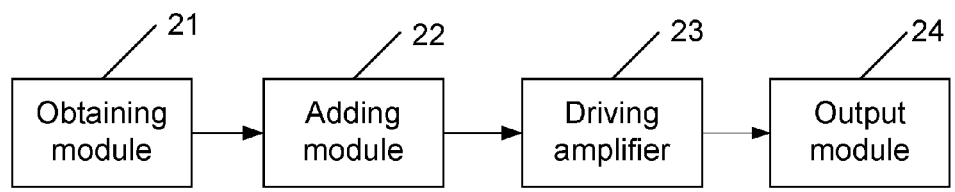
FIG. 5 is a schematic diagram of a device for signal processing according to the second embodiment of the present invention.

FIG. 5 shows a schematic diagram of a device for signal processing according to the second embodiment of the present invention. As shown in FIG. 5, the device includes an obtaining module 21, an adding module 22, a driving amplifier 23 and an output module 24.

The obtaining module 21 obtains a predistortion signal for compensating a nonlinearity distortion generated by a transmission path.

The adding module 22, connected to the obtaining module 21, obtains the predistortion signal from the obtaining module 21, and adds the predistortion signal to the transmission path to compensate the nonlinear distortion.

More specifically, the obtaining module 21 may be a circuit capable of generating the predistortion signal, and the adding module 22 may be a signal line that transmits the predistortion signal to an input end of the driving amplifier 23.

The driving amplifier 23, connected to the adding module 22, amplifies a frequency mixed signal, which is added with the predistortion signal by the adding module 22. The frequency mixed signal includes a first frequency mixed signal and a second frequency mixed signal. The predistortion signal amplified by the driving amplifier 23 compensates the nonlinearity distortion generated by the process that the driving amplifier 23 performs on the first frequency mixed signal and the second frequency mixed signal to obtain an RF signal in which the nonlinearity distortion of the driving amplifier 23 is eliminated.

The predistortion signal has an amplitude $$|3/4 * a3 * F2 * F1 * F1|/a1$$

and a phase ∠θ3+∠F2−∠F1−∠F1+180°−∠θ1.

In the above, ∠F1 and ∠F2 respectively correspond to phases of the first frequency mixed signal F1 and the second frequency mixed signal F2, a1 and a3 respectively correspond to amplitudes of the one-order nonlinear coefficient and the three-order nonlinear coefficient of the driving amplifier, and ∠θ1 and ∠θ3 respectively correspond to phases of the one-order nonlinear coefficient and the three-order nonlinear coefficient of the driving amplifier.

The output module 24, connected to the driving amplifier 23, outputs the RF signal in which the nonlinearity distortion of the driving amplifier 23 is eliminated. More specifically, the output module 24 may be an output portion of the driving amplifier.

Figure 6:
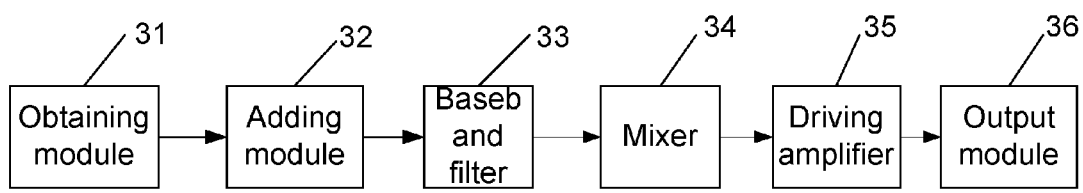
FIG. 6 is a schematic diagram of a device for signal processing according to the third embodiment of the present invention.

FIG. 6 shows a schematic diagram of a device for signal processing according to the third embodiment of the present invention. As shown in FIG. 6, the device includes an obtaining module 31, an adding module 32, a baseband filter 33, a mixer 34, a driving amplifier 35 and an output module 36.

The obtaining module 31 obtains a predistortion signal for compensating a nonlinearity distortion generated by a transmission path.

The adding module 32, connected to the obtaining module 31, obtains the predistortion signal from the obtaining module 21, and adds the predistortion signal to an input end of the baseband filter 33.

The baseband filter 33, connected to the adding module 32, filters a baseband signal, which is added with the predistortion signal by the adding module 32, to obtain a filtered signal. The baseband signal has a frequency $f_{BB}$ and a corresponding baseband bandwidth Δf, and the predistortion signal has a frequency $3*f_{BB}$.

The mixer 34, connected to the baseband filter 33, obtains the filtered signal from the baseband filter 33, and mixes the filtered signal to obtain a frequency mixed signal added with a local oscillation frequency. The frequency mixed signal includes a first frequency mixed signal corresponding to the baseband signal, a second frequency mixed signal generated correspondingly to the nonlinearity of the mixer, and a third frequency mixed signal generated correspondingly to the predistortion signal. More specifically, assuming that the local oscillation frequency is set to a frequency $f_{LO}$, the first frequency mixed signal F1 then has a frequency $f_{LO}+\Delta f$, the second frequency mixed signal has a frequency $3f_{LO}-\Delta f$, and the third frequency mixed signal has a frequency $f_{LO}-3\Delta f$.

The driving amplifier 35, connected to the mixer 34, obtains the frequency mixed signal from the mixer 34 and amplifies the frequency mixed signal. By the amplified third frequency mixed signal, the driving amplifier 35 compensates the nonlinearity distortion of the first frequency mixed signal and the second frequency mixed signal due to the transmission path to obtain an RF signal in which the nonlinearity distortion of the transmission path is eliminated.

The predistortion signal has an amplitude $4/\pi^2 * a3/a1 * o3 * o1 * b1 * b1$ and a phase $3 * \angle o1 + 3 * \angle \beta 1 - \angle o3 - \angle \theta 3 + \angle \theta 1 - 180°$.

In the above, b1 and $\angle \beta 1$ respectively correspond to an amplitude and a phase of the one-order nonlinearity coefficient of the baseband filter, o1 and o3 respectively correspond to amplitudes of the one-order nonlinear coefficient and the three-order nonlinear coefficient of the mixer, $\angle o1$ and $\angle o3$ respectively correspond to phases of the one-order nonlinear coefficient and the three-order nonlinear coefficient of the mixer, a1 and a3 respectively correspond to amplitudes of the one-order nonlinear coefficient and the three-order nonlinear coefficient of the driving amplifier, and $\angle \theta 1$ and $\angle \theta 3$ respectively correspond to phases of the one-order nonlinear coefficient and the three-order nonlinear coefficient of the driving amplifier.

The output module 36, connected to the driving amplifier 35, outputs the RF signal in which the nonlinear distortion of the transmission path is eliminated. More specifically, the output module 36 may be an output portion of the driving amplifier.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for signal processing, comprising:
   obtaining a predistortion signal for compensating a nonlinear distortion generated by a transmission path;
   adding the predistortion signal to the transmission path to compensate the nonlinear distortion; and
   outputting the nonlinear distortion compensated signal by the transmission path;
   wherein, the transmission path is inputted with a baseband signal having a frequency $f_{BB}$, and the predistortion signal has a frequency $3*f_{BB}$.

2. The method according to claim 1, wherein:
   the transmission path comprises a driving amplifier;
   the step of adding the predistortion signal to the transmission path to compensate the nonlinear distortion comprises adding the predistortion signal to an input end of the driving amplifier, and amplifying a frequency mixed signal added with the predistortion signal by the driving amplifier;
   the frequency mixed signal comprises a first frequency mixed signal and a second frequency mixed signal;
   the nonlinear distortion generated by a process that the driving amplifier performs on the first frequency mixed signal and the second frequency mixed signal is compensated by the predistortion signal to obtain an RF signal in which the nonlinear distortion of the driving amplifier is eliminated.

3. The method according to claim 2, wherein the predistortion signal has an amplitude $$|3/4 * a3 * F2 * F1 * F1|/a1$$

and a phase $\angle \theta 33 + F2 - \angle F1 - \angle F1 + 180° - \angle \theta 1$, where $\angle F1$ and $\angle F2$ respectively correspond to phases of the first frequency mixed signal F1 and the second frequency mixed signal F2, a1 and a3 respectively correspond to amplitudes of a one-order nonlinear coefficient and a three-order nonlinear coefficient of the driving amplifier, and $\angle \theta 1$ and $\angle \theta 3$ respectively correspond to phases of the one-order nonlinear coefficient and the three-order nonlinear coefficient of the driving amplifier.

4. The method according to claim 2, wherein:
   the transmission path further comprises a baseband filter and a mixer;
   the step of adding the predistortion signal to the transmission path to compensate the nonlinear distortion comprises adding the predistortion signal to an input end of the baseband filter, and filtering the baseband signal added with the predistortion signal by the baseband filter to obtain a filtered signal;
   the mixer mixes the filtered signal to obtain a frequency mixed signal added with a local oscillation frequency, the frequency mixed signal comprises the first frequency mixed signal corresponding to the baseband signal, the second frequency mixed signal generated correspondingly to the nonlinear distortion of the mixer, and a third frequency mixed signal corresponding to the predistortion signal;
   the driving amplifier amplifies the frequency mixed signal, and the nonlinear distortion of the first frequency mixed signal and the second frequency mixed signal passing through the transmission path is compensated by the amplified frequency mixed signal to obtain the RF signal in which the nonlinear distortion of the transmission path is eliminated.

5. The method according to claim 1, wherein the baseband Signal has a corresponding baseband bandwidth $\Delta f$, the local oscillation frequency is $f_{LO}$, the first frequency mixed signal has a frequency $f_{LO}+\Delta f$, the second frequency mixed signal has a frequency $3f_{LO}-\Delta f$, and the third frequency mixed signal has a frequency $f_{LO}-3\Delta f$.

6. The method according to claim 5, wherein the predistortion signal has an amplitude $4/\pi^2 * a3/a1 * o3 * o1 * b1 * b1$ and a phase $3 * \angle o1 + 3 * \angle \beta 1 - \angle o3 - \angle \theta 3 + \angle \theta 1 - 180°$, where b1 and $\angle \beta 1$ respectively correspond to an amplitude and a phase of a one-order nonlinearity coefficient of the baseband filter, o1 and o3 respectively correspond to amplitudes of a one-order nonlinear coefficient and a three-order nonlinear coefficient of the mixer, $\angle o1$ and $\angle o3$ respectively correspond to phases of the one-order nonlinear coefficient and the three-order nonlinear coefficient of the mixer, a1 and a3 respectively correspond to amplitudes of a one-order nonlinear coefficient and a three-order nonlinear coefficient of the driving amplifier, and $\angle \theta 1$ and $\angle \theta 3$ respectively correspond to phases of the one-order nonlinear coefficient and the three-order nonlinear coefficient of the driving amplifier.

7. The method according to claim 1, wherein the predistortion signal is generated by a modem, a double-carrier modem, or an on-chip microprocessor.

8. A device for signal processing, comprising:
an obtaining module, configured to obtain a predistortion signal for compensating a nonlinear distortion generated by a transmission path;
an adding module, configured to add the predistortion signal to the transmission path to compensate the nonlinear distortion; and
an output module, configured to output the nonlinear distortion compensated signal by the transmission path;
wherein, the transmission path is inputted with a baseband signal having a frequency $f_{BB}$, and the predistortion signal has a frequency $3*f_{BB}$.

9. The device according to claim 8, further comprising a driving amplifier located in the transmission path;
wherein, the adding module adds the predistortion signal to an input end of the driving amplifier; the driving amplifier amplifies a frequency mixed signal added with the predistortion signal, the frequency mixed signal comprises a first frequency mixed signal and a second frequency mixed signal; the nonlinear distortion generated by a process that the driving amplifier performs on the first frequency mixed signal and the second frequency mixed signal is compensated by the amplified predistortion signal from the driving amplifier to obtain an RF signal in which the nonlinear distortion of the driving amplifier is eliminated; the output module is an output portion of the driving amplifier.

10. The device according to claim 9, wherein the predistortion signal has an amplitude $$|3/4*a3*F2*F1*F1|/a1$$

and a phase $\angle\theta3+\angle F2-\angle F1-\angle F1+180°-\angle\theta1$, where $\angle F1$ and $\angle F2$ respectively correspond to phases of the first frequency mixed signal F1 and the second frequency mixed signal F2, a1 and a3 respectively correspond to amplitudes of a one-order nonlinear coefficient and a three-order nonlinear coefficient of the driving amplifier, and $\angle\theta1$ and $\angle\theta3$ respectively correspond to phases of the one-order nonlinear coefficient and the three-order nonlinear coefficient of the driving amplifier.

11. The device according to claim 9, further comprising a baseband filter and a mixer located in the transmission path;
wherein, the adding module adds the predistortion signal to an input end of the baseband filter; the baseband filter filters the baseband signal added with the predistortion signal by the baseband filter to obtain a filtered signal; the mixer mixes filtered signal to obtain a frequency mixed signal added with a local oscillation frequency, the frequency mixed signal comprises the first frequency mixed signal corresponding to the baseband signal, the second frequency mixed signal generated correspondingly to the nonlinear distortion of the mixer, and a third frequency mixed signal corresponding to the predistortion signal; the driving amplifier amplifies the frequency mixed signal, and the nonlinear distortion of the first frequency mixed signal and the second frequency mixed signal passing through the transmission path is compensated by the amplified frequency mixed signal to obtain the RF signal in which the nonlinear distortion of the transmission path is eliminated.

12. The device according to claim 11, wherein the baseband Signal has a corresponding baseband bandwidth $\Delta f$, the local oscillation frequency is $f_{LO}$, the first frequency mixed signal has a frequency $f_{LO}+\Delta f$, the second frequency mixed signal has a frequency $3f_{LO}-\Delta f$, and the third frequency mixed signal has a frequency $f_{LO}-3\Delta f$.

13. The device according to claim 11, wherein the predistortion signal has an amplitude $4/\pi^2*a3/a1*o3*o1*b1*b1$ and a phase $3*\angle o1+3*\angle\beta1-\angle o3-\angle\theta3+\angle\theta1-180°$, where b1 and $\angle\beta1$ respectively correspond to an amplitude and phase of a one-order nonlinearity coefficient of the baseband filter, o1 and o3 respectively correspond to amplitudes of a one-order nonlinear coefficient and a three-order nonlinear coefficient of the mixer, $\angle o1$ and $\angle o3$ respectively correspond to phases of the one-order nonlinear coefficient and the three-order nonlinear coefficient of the mixer, a1 and a3 respectively correspond to amplitudes of a one-order nonlinear coefficient and a three-order nonlinear coefficient of the driving amplifier, and $\angle\theta1$ and $\angle\theta3$ respectively correspond to phases of the one-order nonlinear coefficient and the three-order nonlinear coefficient of the driving amplifier.

14. The device according to claim 8, wherein the obtaining module is a modem, a double-carrier modem, or an on-chip microprocessor.

15. A method for signal processing, comprising:
obtaining a predistortion signal for compensating a nonlinear distortion generated by a transmission path;
adding the predistortion signal to the transmission path to compensate the nonlinear distortion; and
outputting the nonlinear distortion compensated signal by the transmission path,
wherein, the transmission path comprises a driving amplifier; the step of adding the predistortion signal to the transmission path to compensate the nonlinear distortion comprises adding the predistortion signal to an input end of the driving amplifier, and amplifying a frequency mixed signal added with the predistortion signal by the driving amplifier to generate an amplified predistortion signal and an amplified frequency mixed signal having a three-order intermodulation component;
wherein, the amplified predistortion signal and the three-order intermodulation component have opposite phases.

16. The method according to claim 15, wherein the amplitude of the amplified predistortion signal is smaller than or equal to an absolute value of the amplitude of the three-order intermodulation component.

* * * * *